United States Patent
Essaian et al.

[11] Patent Number: 6,159,872
[45] Date of Patent: Dec. 12, 2000

[54] F ION IMPLANTATION INTO OXIDE FILMS TO FORM LOW-K INTERMETAL DIELECTRIC

[75] Inventors: Stepan Essaian, San Jose; Daniel Henry Rosenblatt, San Carlos, both of Calif.

[73] Assignee: National Semiconductor Corporation, Santa Clara, Calif.

[21] Appl. No.: 09/146,720

[22] Filed: Sep. 3, 1998

[51] Int. Cl.[7] .................................................. H01L 21/31
[52] U.S. Cl. ......................... 438/787; 438/597; 257/759; 257/346
[58] Field of Search .................................. 438/787, 597; 257/759, 346

[56] References Cited

U.S. PATENT DOCUMENTS

| | | | |
|---|---|---|---|
| 5,814,863 | 9/1998 | Pan ........................................... | 257/346 |
| 5,828,132 | 10/1998 | Eissa ......................................... | 257/759 |
| 5,858,869 | 1/1999 | Chen et al. ............................... | 438/597 |

OTHER PUBLICATIONS

Shapiro, M.J., et al., "*CVD of fluorosilicate glass for ULSI applications*", Thin Solid Films 270 (1995) Elsevier Sciences S. A., pp. 503–507.

Shimooka, Y., et al., "*Fully Planarized High Density Plasma CVD Fluorine–Doped Ild*", Jun. 10–12, 1997 VMIC Conference, 1997 ISMIC—107/97/0119(c), pp. 119–124.

Mashiro, S., et al., "*Influence of Plasma Parameters on the Stability of FSG Films Prepared by Biased Helicon Plasma CVD*", Jun. 10–12, 1997 VMIC Conference, 1997 ISMIC—107/97/0536(c), pp. 536.

*Primary Examiner*—Richard Elms
*Assistant Examiner*—Pho Luu
*Attorney, Agent, or Firm*—Limbach & Limbach L.L.P.

[57] ABSTRACT

Ion implantation of fluorine into $SiO_2$ films results in formation of a dielectric material having a dielectric constant $K \leq 3.2$. High energies associated with ion implantation permit stable introduction of high concentrations of fluorine within silicon oxide, without giving rise to problems of fluorine outgassing and water absorption associated with conventional FSG deposition techniques. Relatively thick FSG layers conventionally formed by CVD may be sandwiched between implanted FSG liner films formed in accordance with the present invention. Such a combination would reduce the dielectric constant of the dielectric structure as a whole while providing a barrier to fluorine diffusion, without consuming the processing time required to implant an entire dielectric layer.

4 Claims, 4 Drawing Sheets

F ION IMPLANTATION INTO OXIDE FILMS TO FORM LOW-K INTERMETAL DIELECTRIC

BACKGROUND OF THE INVENTION

1. Field of the Invention

The present invention relates to a dielectric material for semiconductor devices and, more particularly, to a dielectric that utilizes ion implantation of fluorine into oxide films.

2. Description of the Related Art

For 0.25 μm ULSI technology and smaller, materials having a dielectric constant K of less than 3 are preferred. Such low-K dielectric materials reduce the parasitic capacitance between adjacent metal lines that can give rise to cross-talking. In addition, low-K dielectric materials reduce the signal time delay τ, where τ=RC~RK, K being the dielectric constant and R being the resistance.

A variety of low-K materials have been studied, ranging from fluorosilicate glass (FSG) to more exotic materials such as amorphous carbon films. Because of the ubiquity of oxide in present processing technology, it would be most convenient if the goal of a low-K dielectric can be achieved using $SiO_2$.

FSG films can be successfully integrated into existing ULSI processes only with an effective dielectric constant of about 3.5 or greater. FSG films are conventionally formed utilizing plasma enhanced chemical vapor deposition (PECVD) or high density plasma chemical vapor deposition (HDPCVD) techniques, utilizing $SiF_4$ gas as the fluorine source. Increasing the ambient $SiF_4$ concentration decreases the dielectric constant of the FSG produced. Unfortunately however, the relatively low energies present during CVD processes (1–2 eV) result in the deposited F being weakly incorporated into the $SiO_2$. This incomplete bonding of fluorine within oxide poses several serious problems.

First, upon heating, the weakly bound and volatile F may evolve as a gas. The fluorine gas may reach interconnect metallization layers adjacent to the FSG, causing delamination at the metal/FSG interface.

Second, incomplete incorporation of F into the $SiO_2$, combined with subsequent outgassing as described above, may produce gaps or vacancies within the $SiO_2$ lattice. When FSG films possessing such defects are exposed to water, water may penetrate into the film. Water can be absorbed by the FSG in two forms: as Si(OH) or as H(OH). The presence of either Si(OH) or H(OH) in the FSG is problematic.

Si(OH) will evolve as water at temperatures above 600° C. H(OH) will evolve as water at temperatures above 200° C. The water so generated can disrupt subsequent high temperature processing steps.

In addition, the presence of Si(OH) in the FSG film increases its dielectric constant, negating the benefit conferred by higher concentrations of fluorine. Furthermore, the presence of H(OH) in the FSG film can lead to corrosion of adjacent metal lines and via poisoning.

Therefore, it is desirable to prepare and utilize a FSG film containing high concentrations of fluorine that are stably incorporated within the oxide.

SUMMARY OF THE INVENTION

The present invention relates to an intermetal dielectric structure having fluorine ions implanted into silicon dioxide. The high energies associated with such implantation result in the stable incorporation of F into the $SiO_2$. This yields a FSG film having a low dielectric constant K due to high F concentration, without the disadvantage of having loosely-bound F in the $SiO_2$ lattice as is associated with FSG formed by conventional chemical vapor deposition techniques.

A process for forming a dielectric material in accordance with one embodiment of the present invention comprises the steps of forming silicon oxide, and then ion implanting sufficient concentrations of fluorine into the silicon oxide to lower the dielectric constant of the silicon oxide to below about 3.2.

A process for forming a dielectric structure in accordance with another embodiment of the present invention comprises the steps of forming a first oxide film over an electrically conductive layer, implanting fluorine ions into the first oxide film to form a lower implanted liner layer, depositing a middle fluorosilicate glass layer on top of the lower implanted liner layer, forming a second oxide film over the middle fluorosilicate glass layer, and implanting fluorine ions into the second oxide film to form a cap implanted liner layer.

A better understanding of the features and advantages of the present invention will be obtained by reference to the following detailed description and accompanying drawings which set forth an illustrative embodiment in which the principles of the invention are utilized.

DETAILED DESCRIPTION

In order to prepare a stable dielectric with a dielectric constant K of ≦3.2 based on FSG, $^{19}F^+$ was implanted into $SiO_2$ films formed by HDPCVD or PECVD. Because energy imparted to F ions during implantation (10–50 KeV) is much higher than energy imparted to F ions during CVD (1–2 eV), it is possible to create FSG films that stably incorporate high concentrations of fluorine.

Figure 1:
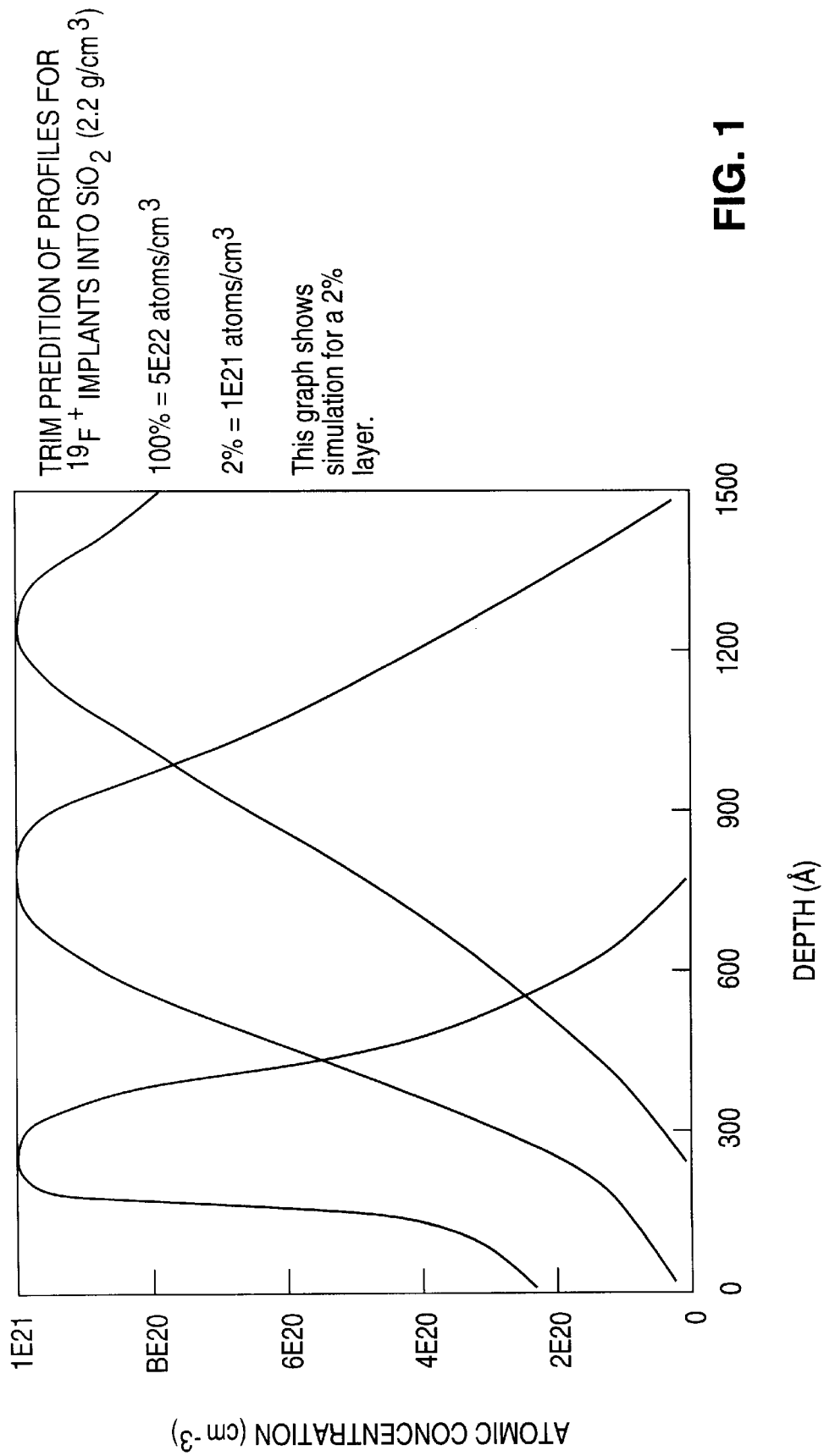
FIG. 1 illustrates the simulated dopant profiles for three $^{19}F^+$ implants of varying energy into a 1500 Å thick $SiO_2$ film having a density of 2.2 g/cm$^3$.

Implantation of F into $SiO_2$ was modeled utilizing TRIM software. The software version was TRIM-90, manufactured by Dr. J. F. Ziegler, IBM-Research, Yorktown, N.Y., run on a HIQ model BDDCO personal computer. This software package simulated implantation based upon the species implanted, and the angle, dose, and energy of implantation. FIG. 1 illustrates the simulated dopant profiles for three $^{19}F^+$ implants of varying energy into a 1500 Å thick $SiO_2$ film having a density of 2.2 g/cm$^3$. FIG. 1 predicts that a triple implant of fluorine, $3.2 \times 10^{15}$ ions/cm$^2$ at 13 KeV, $7.7 \times 10^{15}$ ions/cm$^2$ at 13 KeV, and $1.0 \times 10^{16}$ ions/cm$^2$ at 54 KeV, was required to implant 2% F to a depth of 1500 Å into a $SiO_2$ film.

Actual implantation of $SiO_2$ films in accordance with the present invention was performed utilizing the "Novellus Concept Two" system. The results of implantation under a variety of conditions is described below in TABLE 1.

TABLE 1

Results of F Implantation into
1500Å PECVD and HDPCVD SiO$_2$ Films

| [F] (% by weight) | implant dose (atoms/cm$^2$): implant energy (KeV) | dielectric constant | refractive index |
|---|---|---|---|
| 0 | None | 4.0 ± 0.1 | 1.463 ± 0.002 |
| 1 | 1.6 × 10$^{15}$:13<br>3.9 × 10$^{15}$:33<br>5.0 × 10$^{15}$:54 | 3.4 ± 0.1 | 1.41 ± 0.002 |
| 2 | 3.2 × 10$^{15}$:13<br>7.7 × 10$^{15}$:33<br>1.0 × 10$^{15}$:54 | 3.15 ± 0.1 | 1.38 ± 0.002 |
| 4 | 6.4 × 10$^{15}$:13<br>1.5 × 10$^{15}$:33<br>2.0 × 10$^{15}$:54 | 2.9 ± 0.2 | 1.36 ± 0.002 |

The dielectric constant and refractive index data presented in TABLE 1 has remained constant for both the PECVD and the HDPCVD films after three weeks in a clean room environment. The dielectric constant and refractive index values also did not change when the films were subjected to a thermal cycle of heating from room temperature to 450° C. for two hours, followed by cooling to room temperature. The stable refractive index and dielectric constant values indicate that the implanted fluorine has been stably incorporated within the oxide film.

Implant conditions required to increase the F concentration of the entire thickness of a 6000–10,000 Å SiO$_2$ intermetal dielectric layer would consume too much processing time to be practicable utilizing existing implant technology. Therefore, a first embodiment of an intermetal dielectric structure in accordance with the present invention utilizes relatively thin (500–1500 Å) implanted FSG liner layers that sandwich a conventionally deposited FSG layer. These implanted FSG liner layers reduce the dielectric constant of the dielectric as a whole, and also serve as a barrier to diffusion of fluorine to the interface between the oxide layer and adjacent conducting layers.

Figure 2:
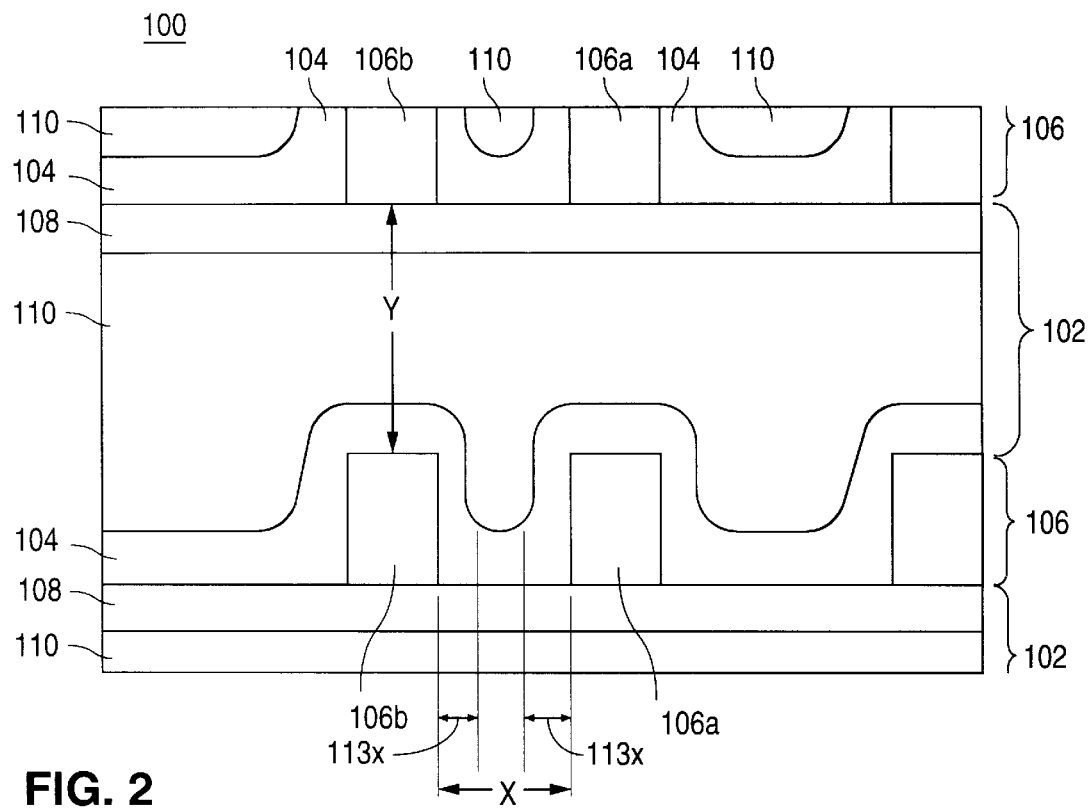
FIG. 2 shows a cross-sectional view of a first embodiment of an interconnect including a dielectric structure in accordance with the present invention.

FIG. 2 shows a cross-sectional view of a portion of interconnect including intermetal dielectric structures in accordance with a first embodiment of the present invention.

Portion 100 of the interconnect includes successive intermetal dielectric structures 102. Intermetal dielectric structures 102 each include a lower implanted FSG liner layer 104 formed over an interconnect metallization layer 106 that includes metal lines 106a and 106b.

Interconnect metallization layer 106 is formed on top of upper implanted FSG liner layer 108 of the preceding intermetal dielectric structure 102. interconnect metallization layer 106 is typically composed of Al, or mixtures of Al and other metals.

Conventionally deposited dielectric layer 110 is formed on top of the lower implanted FSG liner layer 104. Upper implanted FSG liner layer 108 is formed above conventionally deposited dielectric layer 110. Both lower implanted FSG liner layer 104 and upper implanted FSG liner layer 108 have a thickness of between about 500 Å and 1500 Å.

The intermetal dielectric structure 102 shown in FIG. 2 offers a number of important advantages. Parasitic capacitance can arise both within an interconnect metallization layer (between metal lines 106a and 106b), and also between different layers of interconnect metallization. The horizontal distance "X" between adjacent metal lines is typically on the order of 3000 Å. By contrast, the vertical distance "Y" between interconnect metallization layers is typically on the order of 6,000–10,000 Å. Because of the substantially greater spacing between metallization layers, parasitic capacitance and cross-talking between adjacent metal lines within the same interconnect metallization layer is a more significant problem than parasitic capacitance and cross-talking between the successive metallization layers.

Intermetal dielectric structure 102 in accordance with the present invention is particularly effective in combating parasitic capacitance between adjacent metal lines. Specifically, two-thirds of the distance "X" between metal lines 106a and 106b is occupied by the 1000 Å thick lower implanted FSG liner layer 104. Therefore, implanted FSG liner layer 104 makes a substantial contribution to reduction of the overall K experienced between metal lines 106a and 106b.

Similarly, successive interconnect metallization layers 106 are separated by both lower implanted FSG liner layer 104 and upper implanted FSG liner layer 108. However, because the vertical distance "Y" is greater than the horizontal distance "X", implanted FSG liner layers 104 and 108 contribute less to lowering the overall K experienced between successive interconnect metallization layers.

FIGS. 3A–3G show cross-sectional views of process steps leading to formation of a dielectric structure in accordance with one embodiment of the present invention.

Figure 3A:
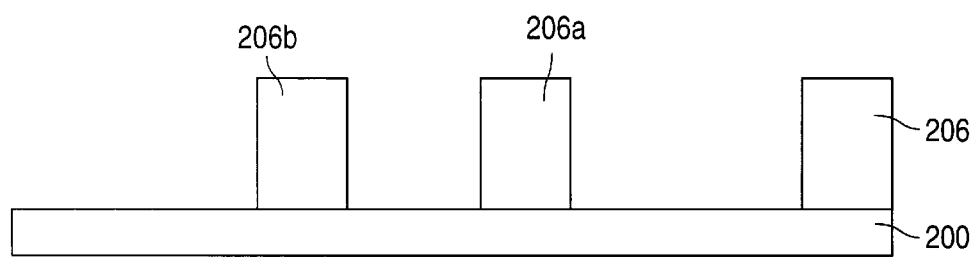
FIGS. 3A–3G show cross-sectional views of steps leading to formation of a dielectric structure in accordance with one embodiment of the present invention.

FIG. 3A shows a cross-sectional view of the starting point for the process in accordance with the present invention. Interconnect metallization layer 206, including adjacent metal lines 206a and 206b, is formed on top of existing layer 200. Existing layer 200 may be an intermetal dielectric or the surface of a semiconductor workpiece.

Figure 3B:
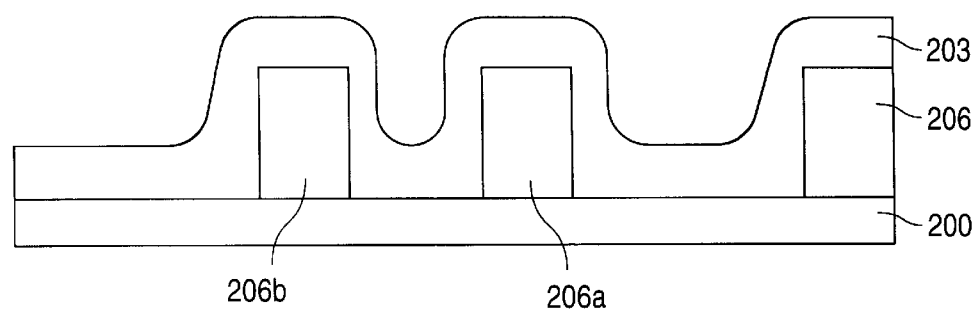

FIG. 3B shows the formation of first oxide film 203 on top of interconnect metallization layer 206. First oxide film 203 may be deposited by either PECVD or HDPCVD.

Figure 3C:
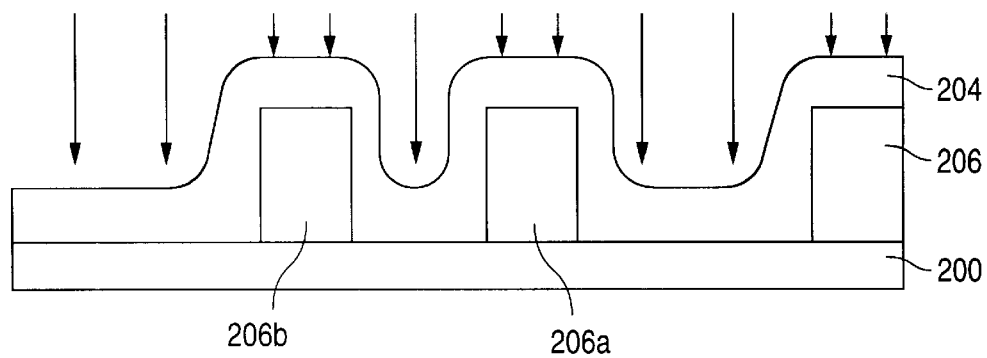

FIG. 3C shows ion implantation of $^{19}$F$^+$ into first oxide film 203 at high energies, forming lower implanted FSG liner layer 204.

Figure 3D:
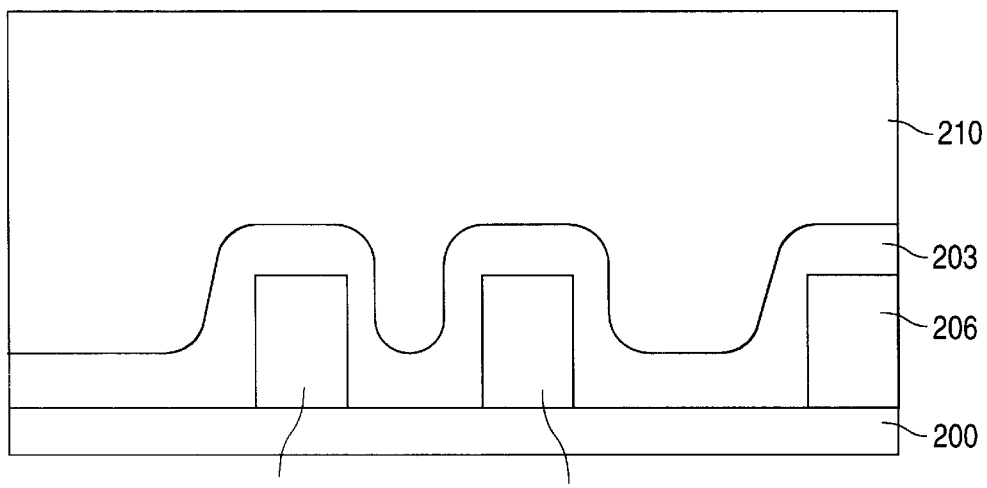

FIG. 3D shows formation of conventionally deposited FSG layer 210 over lower implanted FSG liner layer 204. Conventionally deposited FSG layer 210 is formed by either PECVD or HDPCVD in the presence of a fluorine ambient, resulting in an ultimate F concentration of about 4% or less by weight.

Figure 3E:
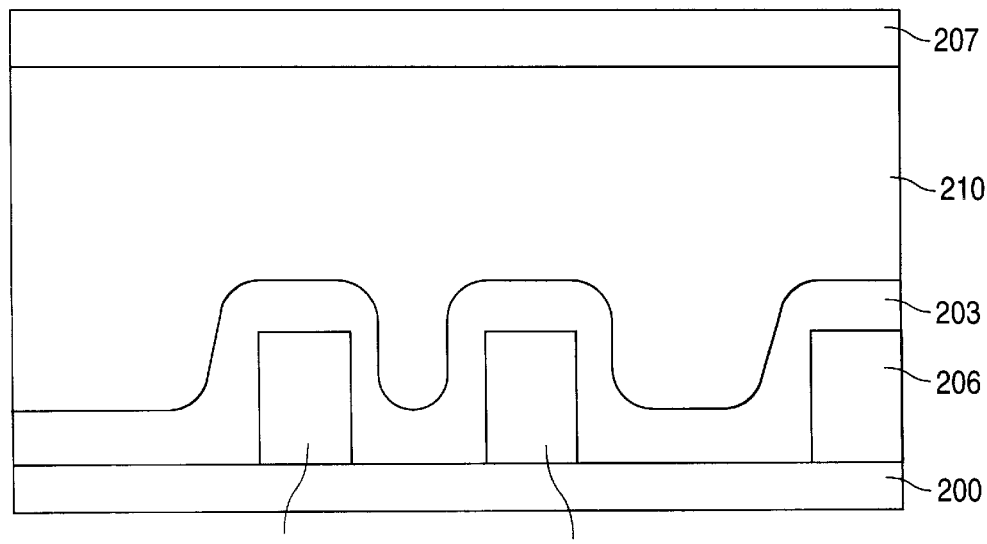
Figure 3F:
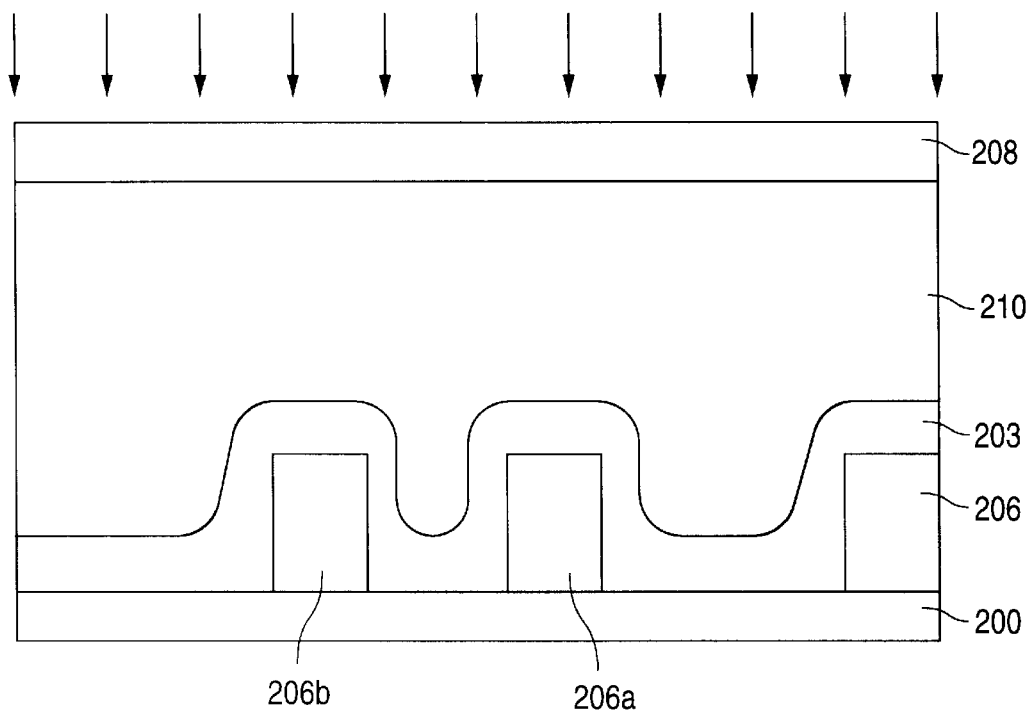
Figure 3G:
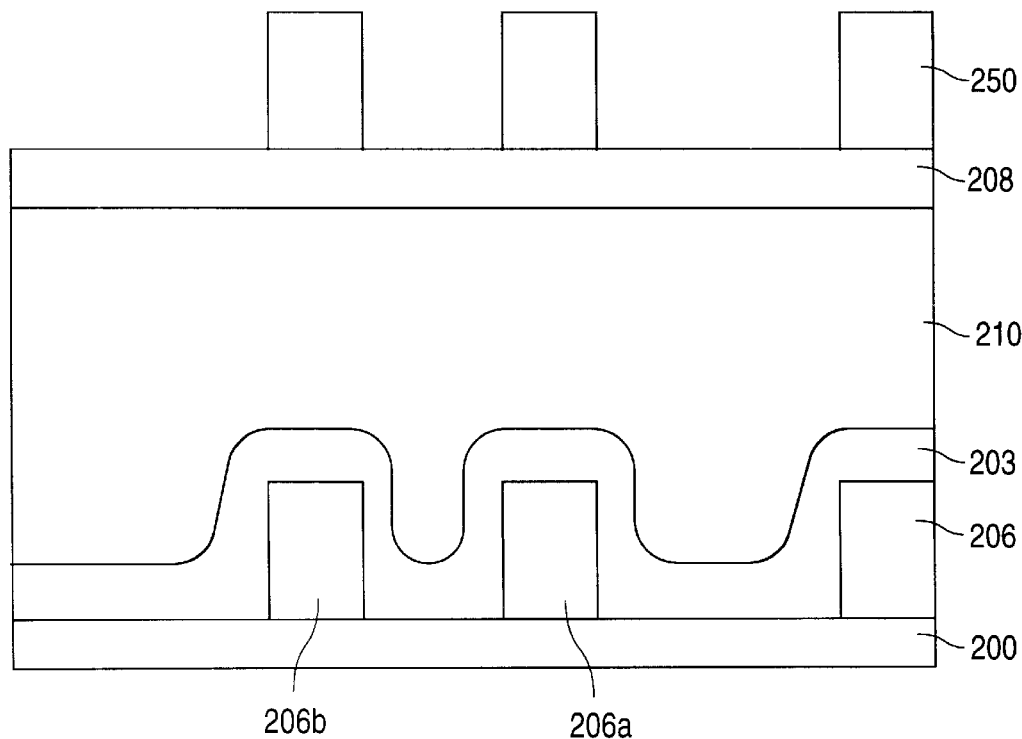

FIG. 3E shows the formation of a second oxide film 207 over conventionally deposited FSG layer 210. FIG. 3F shows implantation of $^{19}$F$^+$ into second oxide film 207, forming cap implanted FSG liner layer 208. FIG. 3G shows formation of the next interconnect metallization layer 250 on top of cap implanted FSG liner layer 208.

The dielectric structure shown in FIG. 2, and the process for forming the dielectric structure depicted in FIGS. 3A–3G, represent only particular embodiments of the present invention. For example, the specific implant conditions for fluorine could deviate from the values given in TABLE 1 without departing from the scope of the present invention.

FIG. 1 reveals that for a less thick oxide liner layer, only one or two fluorine implants may be required.

Moreover, a range of implant doses may be utilized in order to achieve a particular desired fluorine concentrations. For the first implant, a dose of between about 1.6×10$^{15}$ ions/cm$^2$ and 6.4×10$^{15}$ ions/cm$^2$ could be used. For the second implant, a dose of between about 3.9×10$^{15}$ ions/cm$^2$ and 1.5×10$^{16}$ ions/cm$^2$ could be used. For the third implant, a dose of between about $5.0\times10^{15}$ ions/cm$^2$ and $2.0\times10^{16}$ ions/cm$^2$ could be used.

Moreover, the effectiveness of the present invention is not limited to implantation into oxide films initially formed by chemical vapor deposition. SiO$_2$ films to be implanted with F could also be created by wet or dry oxidation of silicon.

Furthermore, while the specific embodiments depicted in FIG. 2 and FIGS. 3A–3G show the dielectric as separating adjacent interconnect metallization layers, the present invention is not limited to such structures. Rather, the F-implanted dielectric can be utilized to isolate a variety of electrically conductive materials, including but not limited to polycide or silicide layers.

Therefore, it is intended that the following claims define the scope of the invention, and that methods and structures within the scope of these claims and their equivalents be covered thereby.

What is claimed is:

1. A process for forming a dielectric material comprising the steps of:
    forming silicon oxide by depositing by one of PECVD and HDPCVD a silicon oxide film having a thickness of between about 500 Å and 1500 Å; and
    ion implanting sufficient concentrations of fluorine into the silicon oxide to lower a dielectric constant of the silicon oxide to below about 3.2 by,
        implanting $^{19}$F$^+$ at an energy of about 13 KeV with a dose of between about $1.6\times10^{15}$ ions/cm$^2$ and $6.4\times10^{15}$ ions/cm$^2$
        implanting $^{19}$F$^+$ at an energy of about 33 KeV with a dose of between about $3.9\times10^{15}$ ions/cm$^2$ and $1.5\times10^{16}$ ions/cm$^2$; and
        implanting $^{19}$F$^+$ at an energy of about 54 KeV with a dose of between about $5.0\times10^{15}$ ions/cm$^2$ and $2.0\times10^{16}$ ions/cm$^2$.

2. A process for forming an intermetal dielectric structure comprising the steps of:
    forming a first oxide film over an electrically conductive material by depositing the first oxide film having a thickness of between about 500 Å and 1500 Å utilizing one of PECVD and HDPCVD;
    implanting fluorine ions into the first oxide film to form a lower implanted FSG liner layer by,
        implanting $^{19}$F$^+$ at an energy of about 13 KeV with a dose of between about $1.6\times10^{15}$ ions/cm$^2$ and $6.4\times10^{15}$ ions/cm$^2$;
        implanting $^{19}$F$^+$ at an energy of about 33 KeV with a dose of between about $3.9\times10^{15}$ ions/cm$^2$ and $1.5\times10^{16}$ ions/cm$^2$, and
        implanting $^{19}$F$^+$ at an energy of about 54 KeV with a dose of between about $5.0\times10^{15}$ ions/cm$^2$ and $2.0\times10^{16}$ ions/cm$^2$;
    forming a dielectric layer on top of the lower FSG liner layer;
    forming a second oxide film over the dielectric layer material by depositing the second oxide film having a thickness of between about 500 Å and 1500 Å utilizing one of PECVD and HDPCVD; and
    implanting fluorine ions into the second oxide film to form a cap implanted FSG liner layer by,
        implanting $^{19}$F$^+$ at an energy of about 13 KeV with a dose of between about $1.6\times10^{15}$ ions/cm$^2$ and $6.4\times10^{15}$ ions/cm$^2$;
        implanting $^{19}$F$^+$ at an energy of about 33 KeV with a dose of between about $3.9\times10^{15}$ ions/cm$^2$ and $1.5\times10^{16}$ ions/cm$^2$, and
        implanting $^{19}$F$^+$ at an energy of about 54 KeV with a dose of between about $5.0\times10^{15}$ ions/cm$^2$ and $2.0\times10^{16}$ ions/cm$^2$.

3. A dielectric structure comprising:
    a lower implanted FSG liner layer having a stable F concentration of between about 1% and 4% by weight;
    a middle dielectric layer formed on top of the lower implanted FSG liner layer; and
    a cap implanted FSG liner layer having a stable F concentration of between about 1% and 4% by weight formed on top of the dielectric layer.

4. The intermetal dielectric structure according to claim 3 wherein,
    the lower implanted oxide layer and the cap implanted oxide layer are each between about 500 Å and 1500 Å thick; and
    the middle dielectric layer is a CVD fluorosilicate glass layer between about 6000 Å and 10,000 Å thick.

* * * * *